(12) United States Patent
Ichikawa et al.

(10) Patent No.: US 11,114,522 B2
(45) Date of Patent: Sep. 7, 2021

(54) DISPLAY DEVICE, MANUFACTURING METHOD OF DISPLAY DEVICE, AND EXPOSURE DEVICE

(71) Applicant: SHARP KABUSHIKI KAISHA, Sakai (JP)

(72) Inventors: Shinji Ichikawa, Sakai (JP); Hiroki Taniyama, Sakai (JP); Shinsuke Saida, Sakai (JP); Ryosuke Gunji, Sakai (JP); Tohru Okabe, Sakai (JP); Yoshihiro Nakada, Yonago (JP); Hiroharu Jinmura, Yonago (JP); Akira Inoue, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/651,345

(22) PCT Filed: Sep. 29, 2017

(86) PCT No.: PCT/JP2017/035657
§ 371 (c)(1),
(2) Date: Mar. 26, 2020

(87) PCT Pub. No.: WO2019/064543
PCT Pub. Date: Apr. 4, 2019

(65) Prior Publication Data
US 2020/0235195 A1    Jul. 23, 2020

(51) Int. Cl.
*H01L 27/32* (2006.01)
*H01L 51/52* (2006.01)
*H01L 51/56* (2006.01)

(52) U.S. Cl.
CPC ........ *H01L 27/3279* (2013.01); *H01L 51/525* (2013.01); *H01L 51/56* (2013.01)

(58) Field of Classification Search
CPC .............. G09F 9/30; H01L 2251/5315; H01L 2251/558; H01L 27/32; H01L 27/3246; H01L 27/3279; H01L 51/525; H01L 51/56; H05B 33/10; H05B 33/22
See application file for complete search history.

(56) References Cited

U.S. PATENT DOCUMENTS

2004/0150319 A1*   8/2004   Tomimatsu ......... H01L 27/3246
                                                        313/495
2006/0197446 A1    9/2006   Tomimatsu et al.
(Continued)

FOREIGN PATENT DOCUMENTS

JP    2003-228302 A    8/2003
JP    2007-178649 A    7/2007
(Continued)

*Primary Examiner* — Mohammed Shamsuzzaman
(74) *Attorney, Agent, or Firm* — ScienBiziP, P.C.

(57) ABSTRACT

A display device includes a plurality of picture elements, wherein a first electrode is formed in each of the plurality of picture elements, a cover layer is formed such that an opening of the first electrode is formed, a spacer in a layer identical to the cover layer is provided between two of the first electrodes, the spacer is formed with a height greater than a height of the cover layer, and an outer edge portion of the spacer is spaced from an outer edge portion of the cover layer.

4 Claims, 18 Drawing Sheets

(56) References Cited

U.S. PATENT DOCUMENTS

| | | | |
|---|---|---|---|
| 2007/0128551 A1* | 6/2007 | Lee | H01L 27/1214 |
| | | | 430/311 |
| 2011/0095294 A1* | 4/2011 | Lee | H01L 27/1244 |
| | | | 257/59 |
| 2015/0021571 A1 | 1/2015 | Yamakita | |
| 2019/0198592 A1* | 6/2019 | Zhang | H01L 21/3086 |

FOREIGN PATENT DOCUMENTS

| | | |
|---|---|---|
| JP | 2011-233341 A | 11/2011 |
| JP | 2015-022914 A | 2/2015 |

\* cited by examiner

DISPLAY DEVICE, MANUFACTURING METHOD OF DISPLAY DEVICE, AND EXPOSURE DEVICE

TECHNICAL FIELD

The present invention relates to a display device or the like.

BACKGROUND ART

In general, an electronic device such as a display device is formed by layering layers having various functions. In processes of manufacturing such electronic devices, spacers may be provided. In the display device disclosed in Japanese Patent Application Laid-Open No. 2015-22914, a pillar functioning as a spacer is provided between an element panel and a sealing panel.

SUMMARY OF INVENTION

In a case where a spacer is formed through photolithography, a height of the spacer may be less than a desired height through baking after exposure. In processes of manufacturing an electronic device, preferably, the height of the spacer is a designed height.

An object of an aspect of the present invention is to provide an exposure device or the like that can form a spacer with a desired height.

A display device according to an aspect of the present invention is a display device including a plurality of picture elements. A first electrode is formed in each of the plurality of picture elements, a cover layer is formed such that an opening of the first electrode is formed, a spacer in a layer identical to the cover layer is provided between two of the first electrodes, the spacer is formed with a height greater than a height of the cover layer, and an outer edge portion of the spacer is spaced from an outer edge portion of the cover layer.

An exposure device according to an aspect of the present invention is an exposure device configured to perform patterning through photolithography. The exposure device includes a light source configured to emit light to an organic film and a photomask configured to block some light from the light source The photomask includes a light blocking portion configured to block the light, a light-transmitting portion formed around the light blocking portion and configured to allow transmission of the light; and a translucent portion formed adjacent to the light-transmitting portion and configured to allow partial transmission of the light.

An exposure device according to an aspect of the present invention is an exposure device configured to perform patterning through photolithography. The exposure device includes a light source configured to emit light to an organic film and a photomask configured to block some light from the light source. The photomask includes a light-transmitting portion configured to allow transmission of the light, a light blocking portion formed around the light-transmitting portion and configured to block the light, and a translucent portion formed adjacent to the light blocking portion and configured to allow partial transmission of the light.

A method for manufacturing a display device according to an aspect of the present invention includes disposing a photomask with respect to a photosensitive organic film to perform patterning through photolithography and emitting light to the photosensitive organic film through the photomask. The photomask includes a light blocking portion configured to block the light, a light-transmitting portion formed around the light blocking portion and configured to allow transmission of the light, and a translucent portion formed adjacent to the light-transmitting portion and configured to allow partial transmission of the light.

According to an aspect of the present invention, a spacer with a desired height can be formed.

BRIEF DESCRIPTION OF DRAWINGS

FIG. 6(a) illustrates a state before baking, and FIG. 6(b) illustrates a state after baking.

FIG. 7(a) illustrates a state before baking, and FIG. 7(b) illustrates a state after baking.

DESCRIPTION OF EMBODIMENTS

Figure 1:
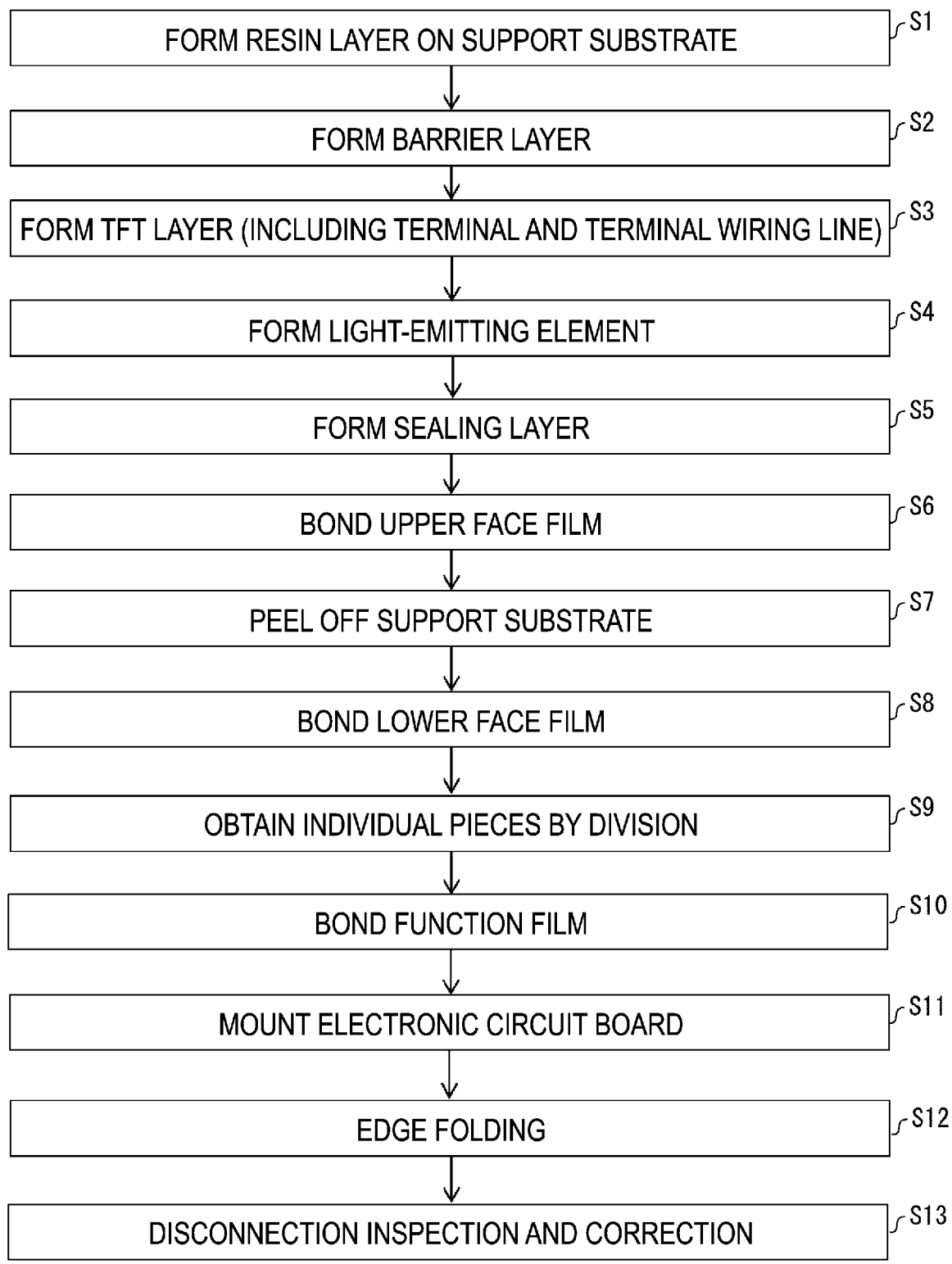
FIG. 1 is a flowchart illustrating an example of a method of manufacturing a display device.
Figure 2:
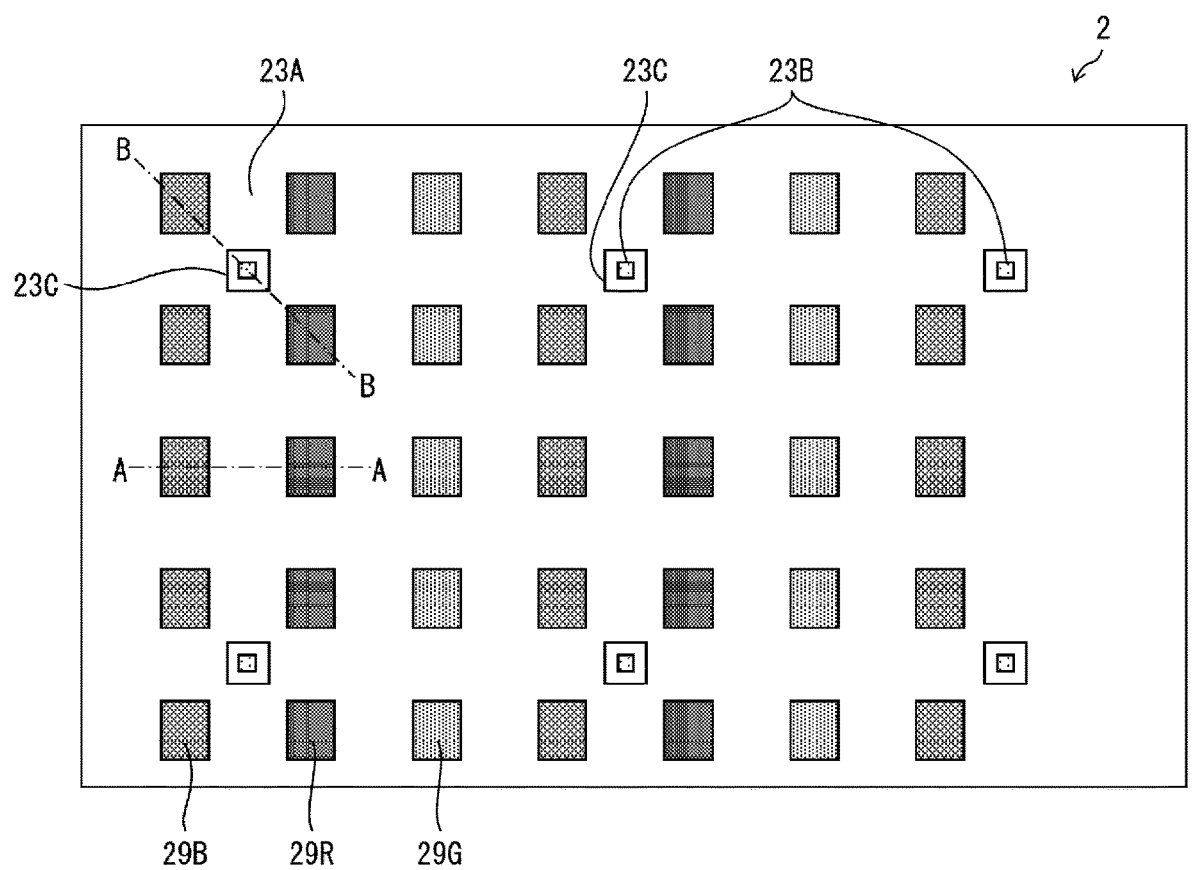
FIG. 2 is a plan view illustrating arrangement of a subpixel, a cover layer, and a spacer in a display device.
Figure 3:
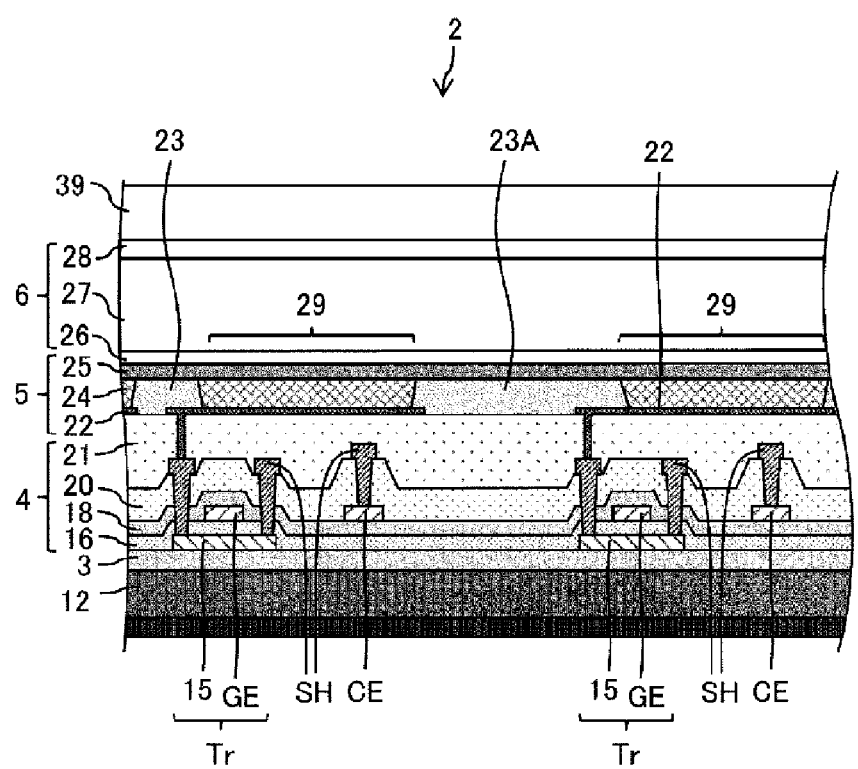
FIG. 3 is a cross-sectional view taken along line A-A in FIG. 2, illustrating a configuration example of a display portion of a display device.
Figure 4:
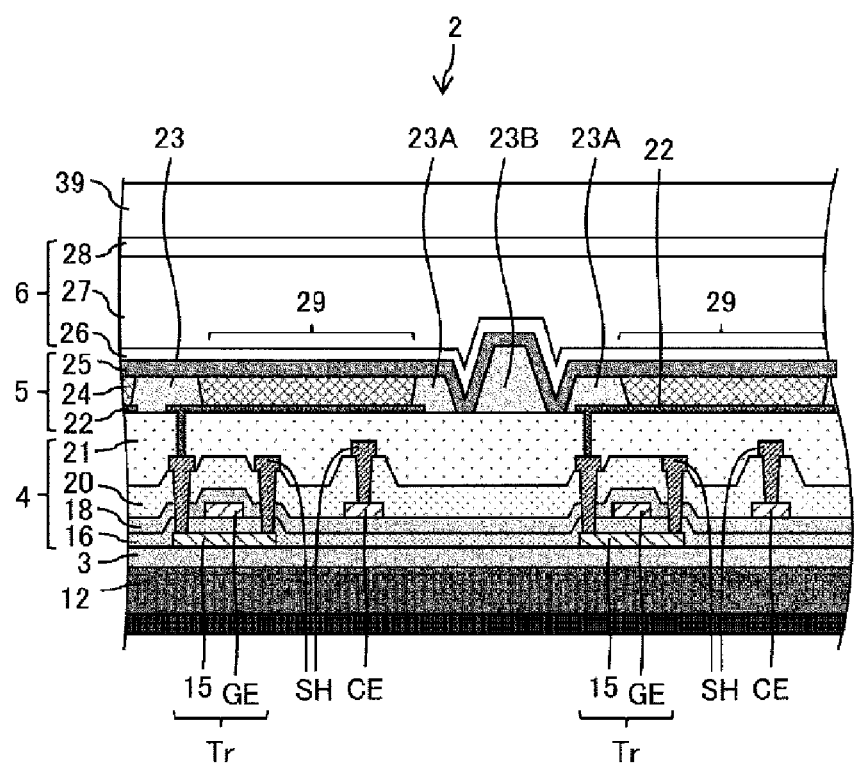
FIG. 4 is a cross-sectional view taken along line B-B in FIG. 2, illustrating a configuration example of a display portion of a display device.
Figure 5:
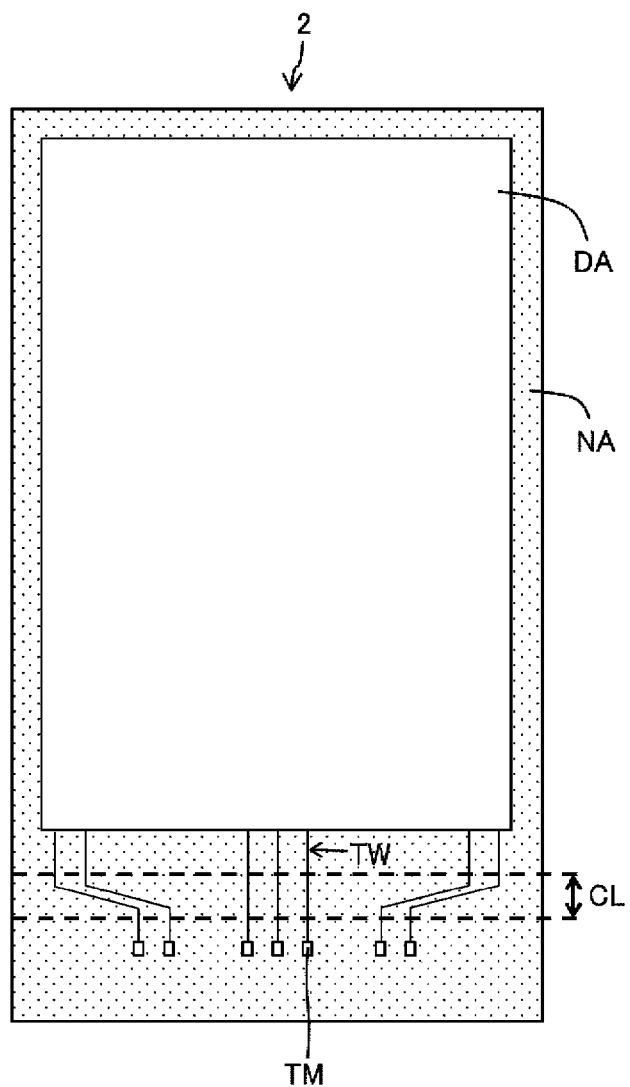
FIG. 5 is a plan view illustrating a configuration example of a display device.

FIG. 1 is a flowchart illustrating an example of a method of manufacturing a display device (an electronic device). FIG. 2 is a plan view illustrating arrangement of a subpixel, a cover layer, and a spacer in a display device. FIG. 3 is a cross-sectional view taken along line A-A in FIG. 2, illustrating a configuration example of a display portion of a display device. FIG. 4 is a cross-sectional view taken along line B-B in FIG. 2, illustrating a configuration example of a display portion of a display device. FIG. 5 is a plan view illustrating a configuration example of a display device.

In the following description, "the same layer" refers to a layer formed of the same material through the same process, "a lower layer" refers to a layer formed in a process before a process in which a layer to be compared is formed, and "an upper layer" refers to a layer formed in a process after the process in which the layer to be compared is formed.

In a case where a flexible display device is manufactured, as illustrated in FIGS. 1 to 4, first, a resin layer 12 is formed on a transparent support substrate (a mother glass substrate, for example) (step S1). Next, a barrier layer 3 is formed (step S2). Next, a thin film transistor (TFT) layer 4 including a terminal TM and a terminal wiring line TW is formed (step S3). Next, a top-emission type light-emitting element layer (for example, an organic light-emitting diode (OLED) element layer) 5 is formed (step S4). Next, a sealing layer 6 is formed (step S5). Next, an upper face film is bonded to the sealing layer 6 (step S6).

Next, a lower face of the resin layer 12 is irradiated with a laser light through the support substrate to reduce a bonding force between the support substrate and the resin layer 12, and the support substrate is peeled from the resin layer 12 (step S7). Next, a lower face film 10 is bonded to the lower face of the resin layer 12 (step S8). Next, a layered body including the lower face film 10, the resin layer 12, the barrier layer 3, the TFT layer 4, the light-emitting element layer 5, and the sealing layer 6 is divided and a plurality of individual pieces are obtained (step S9). Next, a function film 39 is bonded on the obtained individual pieces (step S10). Next, an electronic circuit board (IC chip, for example) is mounted on the terminal for external connection (step S11). Next, an edge folding process (a process of folding a bending section CL in FIG. 3 by 180 degrees) is performed to make the display device 2 (step S12). Next, disconnection inspection is performed, and if there is a disconnection, the disconnection is corrected (step S13). Note that, each of the steps is performed by a display device manufacturing apparatus that will be described below.

Examples of the material of the resin layer 12 include polyimide, epoxy, and polyamide. Examples of the material used in the lower face film 10 include polyethylene terephthalate (PET).

The barrier layer 3 is a layer that prevents moisture or impurities from reaching the TFT layer 4 or the light-emitting element layer 5 when the display device is being used, and can be configured by a silicon oxide film, a silicon nitride film, or a silicon oxynitride film, or by a layered film of these, for example, formed using chemical vapor deposition (CVD).

The TFT layer 4 includes a semiconductor film 15, an inorganic insulating film 16 (a gate insulating film) in an upper layer than the semiconductor film 15, a gate electrode GE in an upper layer than the inorganic insulating film 16, an inorganic insulating film 18 in an upper layer than the gate electrode GE, a capacitance wiring line CE in an upper layer than the inorganic insulating film 18, an inorganic insulating film 20 in an upper layer than the capacitance wiring line CE, a source wiring line SH and a terminal TM in an upper layer than the inorganic insulating film 20, and a flattening film 21 in an upper layer than the source wiring line SH and the terminal TM.

A thin film transistor Tr (TFT) includes the semiconductor film 15, the inorganic insulating film 16 (the gate insulating film), and the gate electrode GE.

In a non-display area NA of the TFT layer 4, the terminal TM used for connection with an IC chip or an electronic circuit board such as an FPC and the terminal wiring line TW (described below) that connects the terminal TM and a wiring line in an active area DA and the like are formed.

The semiconductor film 15 is formed of low-temperature polysilicon (LTPS) or an oxide semiconductor, for example. Note that, the TFT provided with the semiconductor film 15 for forming the channel is illustrated as a top gate structure in FIG. 2; however, the TFT may have a bottom gate structure (in a case where the channel of the TFT is formed in an oxide semiconductor, for example).

The gate electrode GE, the capacitance electrode CE, the source wiring line SH, the terminal wiring line TW, and the terminal TM are configured by a single layer film or a layered film of a metal containing at least one of aluminum (Al), tungsten (W), molybdenum (Mo), tantalum (Ta), chromium (Cr), titanium (Ti), and copper (Cu), for example.

The inorganic insulating films 16, 18, and 20 can be configured, for example, by a silicon oxide (SiOx) film or a silicon nitride (SiNx) film, or a layered film of these, formed using CVD.

The flattening film (interlayer insulating film) 21 can be formed of a coatable photosensitive organic material, such as a polyimide or an acrylic, for example.

The light-emitting element layer 5 (an organic light-emitting diode layer, for example) includes an anode 22 in an upper layer than the flattening film 21, a cover layer 23A as an electrode edge cover that covers an edge of the anode 22 (a reflective electrode), a spacer 23B (described below), an electroluminescence (EL) layer 24 in an upper layer than the anode 22, and a cathode 25 in an upper layer than the EL layer 24. A light-emitting element (an organic light-emitting diode (OLED), for example) including the anode 22 and the EL layer 24, which are formed in an island shape, and the cathode 25; and a subpixel circuit configured to drive the light-emitting element are provided for each subpixel 29 (picture element). The cover layer 23A and the spacer 23B are organic films formed from a photosensitive organic material and are formed by a film formation device 30, which will be described later.

As illustrated in FIG. 2, in the embodiment, the display device 2 includes, as the subpixels 29, 3-color picture elements including a red picture element 29R, a blue picture element 29B, and a green picture element 29G. One pixel is represented by these three picture elements. However, the picture elements included in the display device 2 are not limited to the three colors of R, G, and B, and white or yellow may be added to provide four or more colors, and there is no particular limitation.

For example, the EL layer 24 is formed by layering a hole injection layer, a hole transport layer, a light-emitting layer, an electron transport layer, and an electron injection layer in this order, with the hole injection layer being the bottom layer. While the light-emitting layer is formed in an island shape for each subpixel 29 by a vapor deposition method or an ink-jet method, the other layers may be formed as a solid-like common layer. In addition, a configuration is also possible in which more than one layer are not formed, out of the hole injection layer, the hole transport layer, the electron transport layer, and the electron injection layer.

The anode electrode (anode) 22 is formed by layering of Indium Tin Oxide (ITO) and silver (Ag) or alloy containing Ag, for example, and has light reflectivity (described in detail below). The cathode 25 may be formed of a transparent conductive material such as Indium Tin Oxide (ITO) or Indium zinc Oxide (IZO).

In the case where the light-emitting element layer 5 is an OLED layer, positive holes and electrons recombine inside the EL layer 24 in response to a drive current between the anode 22 and the cathode 25, and light is emitted as a result of excitons, which are generated by the recombination, falling into a ground state. Since the cathode 25 is transparent and the anode 22 has light reflectivity, the light emitted from the EL layer 24 travels upward and becomes top-emitting.

The light-emitting element layer 5 may be used not only in a case of constituting the OLED element, but also in a case of constituting an inorganic light-emitting diode or a quantum dot light-emitting diode.

The sealing layer 6 is transparent and includes a first inorganic sealing film 26 covering the cathode 25, an organic sealing film 27 formed on the first inorganic sealing film 26, and a second inorganic sealing film 28 covering the organic sealing film 27. The sealing layer 6 covering the light-emitting element layer 5 prevents foreign matter, such as water and oxygen from infiltrating the light-emitting element layer 5.

The first inorganic sealing film 26 and the second inorganic sealing film 28 may be each configured by a silicon oxide film, a silicon nitride film, or a silicon oxynitride film, or by a layered film of these, formed through CVD. The organic sealing film 27 is thicker than the first inorganic sealing film 26 and the second inorganic sealing film 28, is a light-transmissive organic film, and can be formed of a coatable photosensitive organic material such as a polyimide or an acrylic.

The lower face film 10 is bonded on the lower face of the resin layer 12 after the support substrate is peeled off, and this can achieve a display device with excellent flexibility. Examples of the material of the lower face film 10 include PET. The function film 39 has an optical compensation function, a touch sensor function, a protection function, or the like, for example.

The description is given for the case of manufacturing a flexible display device; however, in the case of manufacturing a non-flexible display device, since replacement or the like of the substrate is not needed, the process proceeds from step S5 to step S9 in FIG. 1, for example.

First Embodiment

Figure 6:
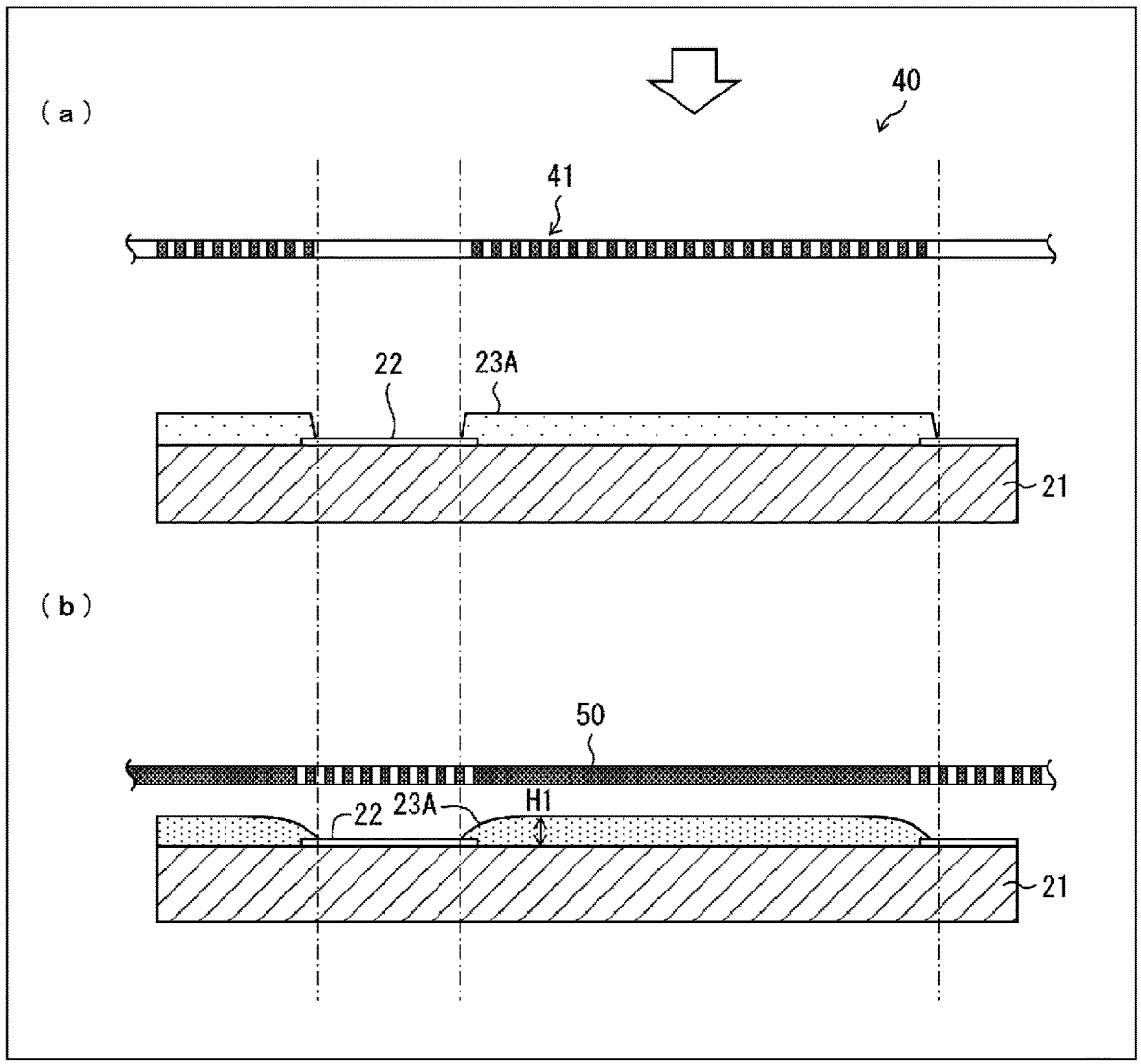
FIG. 6 is a cross-sectional view taken along line A-A in FIG. 2, illustrating a method of forming a cover layer and a spacer.
Figure 7:
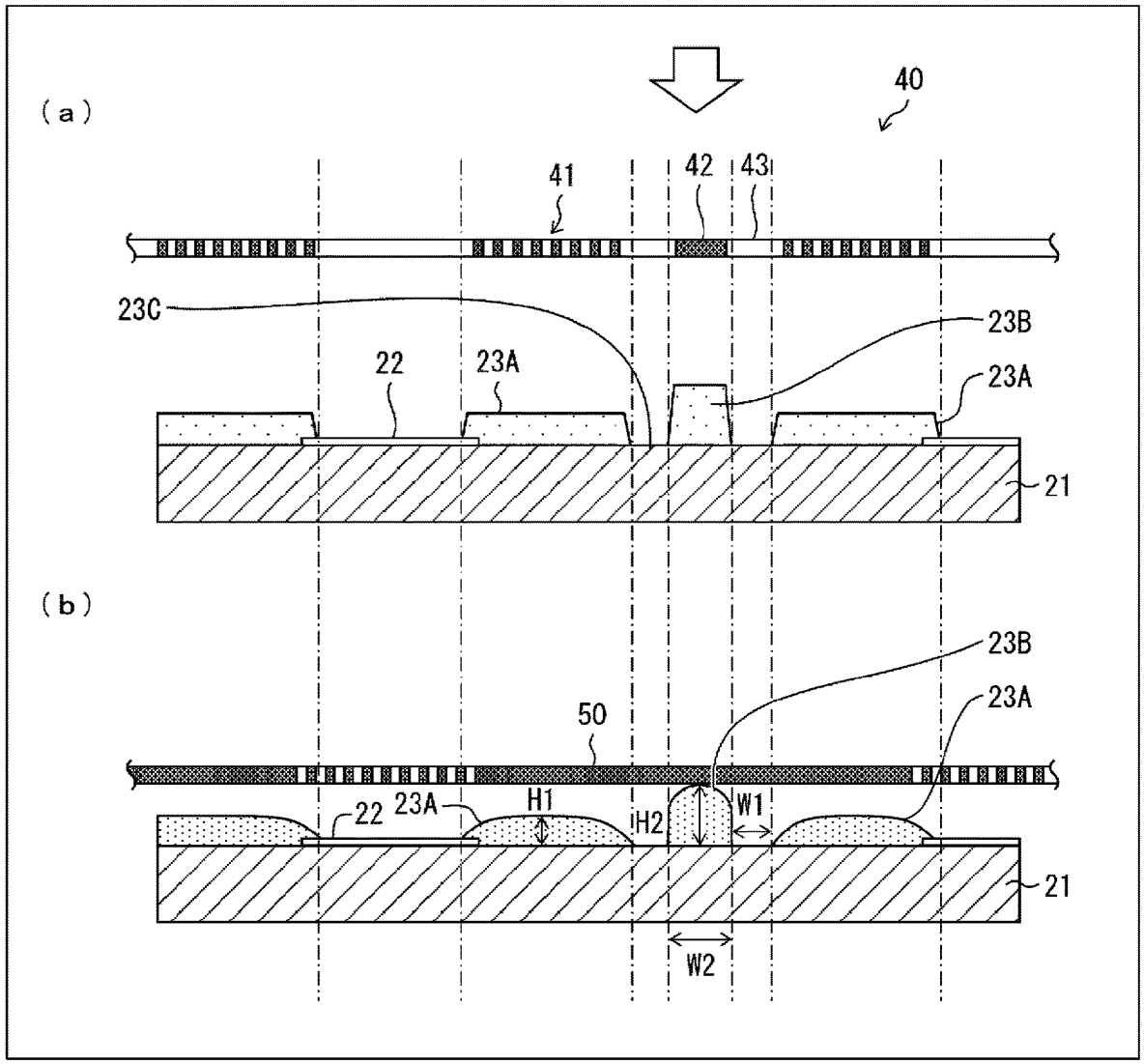
FIG. 7 is a cross-sectional view taken along line B-B in FIG. 2, illustrating a method of forming a cover layer and a spacer.

FIG. 6 is a cross-sectional view taken along line A-A in FIG. 2, illustrating a method of forming a cover layer 23A and a spacer 23B, FIG. 6(a) illustrates a state before baking, and FIG. 6(b) illustrates a state after baking. FIG. 7 is a cross-sectional view taken along line B-B of FIG. 2, illustrating a method of forming a cover layer 23A and a spacer 23B, FIG. 7(a) illustrates a state before baking and FIG. 7(b) illustrates a state after baking.

The spacer 23B is not illustrated in FIGS. 3 and 6 illustrating a cross section taken along line A-A, and the spacer 23B is illustrated in FIGS. 4 and 7 illustrating a cross section taken along line B-B.

As illustrated in (a) of FIG. 7, the cover layer 23A and the spacer 23B are organic films formed as the same layer on the surface of the flattening film 21, and are patterned through photolithography. The cover layer 23A and the spacer 23B may be formed of a coatable photosensitive organic material, such as polyimide or acrylic, for example.

The cover layer 23A covers the edge of each of the plurality of anodes 22 (a first electrode) and forms an opening in the anode 22. The spacer 23B is formed between the cover layers 23A.

The cover layer 23A is an organic film that covers the edge of the anode 22 serving as a reflective electrode and serves as an electrode edge cover that defines an outer edge shape of the exposed surface of the anode 22. As illustrated in FIGS. 3 and 4, the cover layer 23A is formed between the flattening film 21 and the cathode 25 (a second electrode) and is located at the outer edge portion of the subpixel SP serving as a light-emitting element.

The spacer 23B is a bank that serves as a spacer when the vapor deposition mask 50 is disposed, and is formed on the surface of the flattening film 21. As illustrated in (b) of FIG. 7, the spacer 23B has a height H2 from the surface of the flattening film 21 after baking that is greater than a height H1 of the cover layer 23A. The height H2 is from 2 to 5 μm for example, and the height H1 is from 1 to 3 μm for example.

The vapor deposition mask 50 is a mask that causes vapor deposition particles (for example, an organic light-emitting material) for forming the light-emitting layer in the EL layer 24 to be vapor deposited and includes a plurality of through-holes corresponding to a desired vapor deposition pattern. The EL layer 24 is layered on each of the anodes 22, and the cathode 25 opposite to the anode 22 is formed in an upper layer than the layered EL layer 24. That is, the EL layer 24 including the light-emitting layer is formed between the anode 22 and the cathode 25. In addition, the cover layer 23A and the spacer 23B can also be described as being formed between the flattening film 21 and the cathode 25.

The spacer 23B is formed on the surface of the flattening film 21, is adjacent to the cover layer 23A, and is spaced from the cover layer 23A. A region between the outer edge portion of the cover layer 23A and the outer edge portion of the spacer 23B is referred to as a spacing region 23C. A distance W1 between the outer edge portion of the cover layer 23A and the outer edge portion of the spacer 23B (i.e., a width of the spacing region 23C) is from 2 to 5 μm for example. The outer edge portion of the cover layer 23A and the outer edge portion of the spacer 23B need to be formed at intervals greater than or equal to a resolution of the exposure device 33 to be used (for example, 2 μm or greater). The width W2 of the spacer 23B itself is not particularly limited to a specific value, but is from 8 to 12 μm for example.

As illustrated in FIG. 7, when the vapor deposition mask 50 is disposed, the cover layer 23A may be damaged in a case where a physical load is directly applied on the cover layer 23A. In the case where the cover layer 23A is damaged, the anode 22 and cathode 25 may be short-circuited. Accordingly, preferably, the cover layer 23A is prevented from being damaged. For this reason, the spacer 23B having a height greater than that of the cover layer 23A is provided. Since the spacer 23B can receive the physical load, the cover layer 23A is prevented from being damaged.

Figure 8:
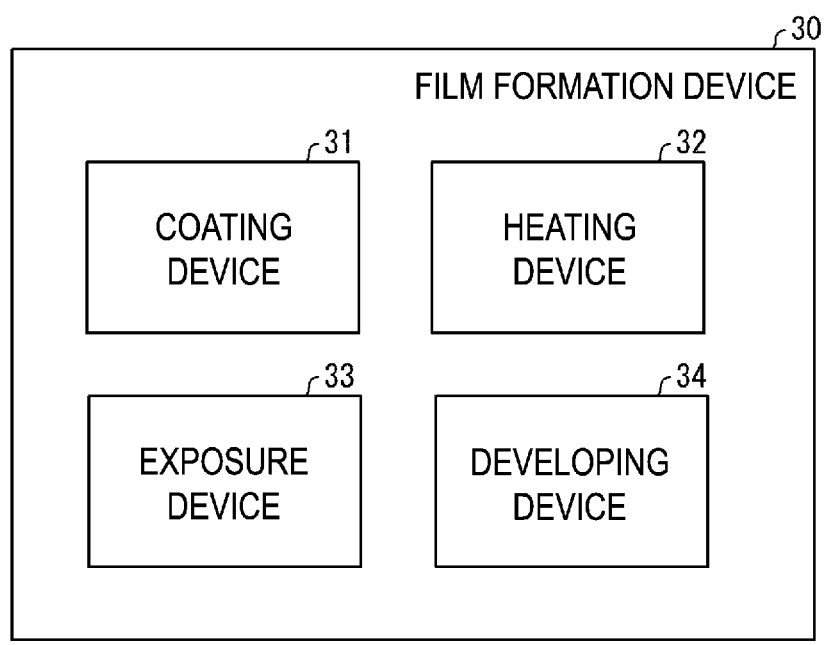
FIG. 8 is a block diagram illustrating a configuration of a film formation device.

FIG. 8 is a block diagram illustrating a configuration of the film formation device 30. The film formation device 30 is a device configured to pattern the cover layer 23A and the spacer 23B through photolithography, and as illustrated in FIG. 8, includes a coating device 31, a heating device 32, an exposure device 33, and a developing device 34.

The coating device 31 is a device configured to apply a photosensitive organic material for forming the cover layer 23A and the spacer 23B on the surface of the flattening film 21. As the coating device 31, a spin coating or a slit coating type coating device can be used, for example.

The heating device 32 is a heater for prebaking.

The exposure device 33 is a device configured to perform patterning through photolithography. The exposure device 33 emits light through the photomask 40 toward the applied photosensitive organic material and causes the solubility of some of the photosensitive organic material in a developing solution to be increased.

The developing device 34 is a device configured to remove the portion of the photosensitive organic material irradiated with light in the developing solution.

Figure 9:
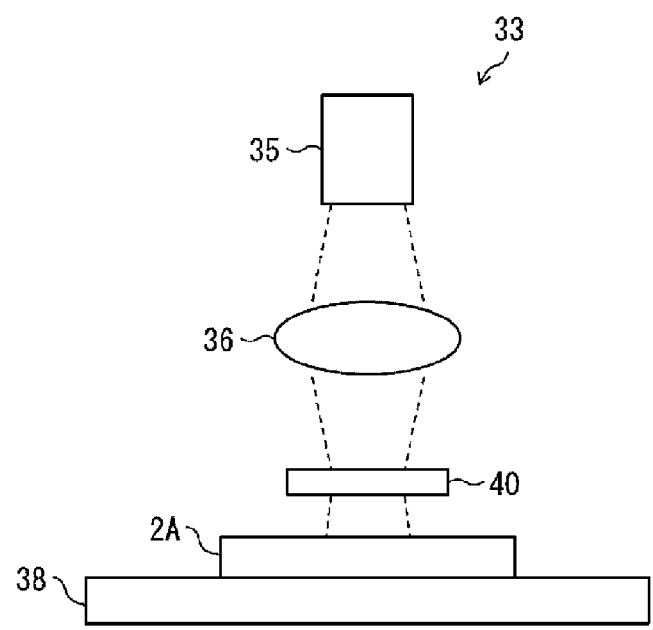
FIG. 9 is a conceptual diagram illustrating a configuration of an exposure device.

FIG. 9 is a conceptual diagram illustrating a configuration of the exposure device 33. As illustrated in FIG. 9, the exposure device 33 includes a light source 35, a light collection optical system 36, a photomask 40, and a stage 38 on which a display device 2A during manufacturing is placed.

The light collection optical system 36 performs light distribution control of light emitted from the light source 35 (hereinafter referred to as emitted light), and the photomask 40 is irradiated with the light. A known light source such as a high-pressure mercury lamp may be used as the light source 35, and a wavelength suitable for the photosensitive organic material to be used may be selected for the wavelength of emitted light. A g-line, a h-line, an i-line, mixed wavelengths thereof, or the like, can be used as wavelengths.

Figure 10:
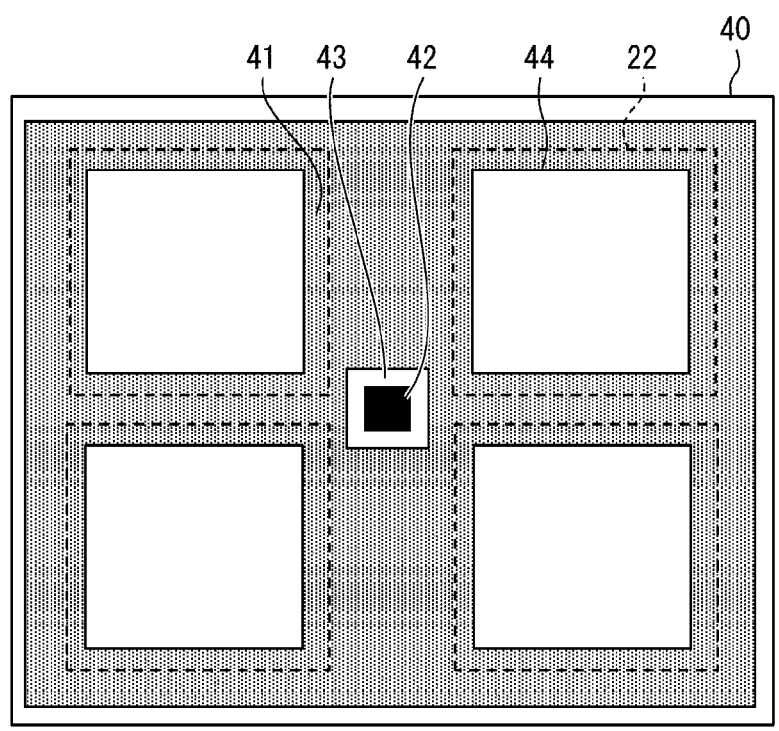
FIG. 10 is a plan view schematically illustrating an example of a configuration of a photomask.

FIG. 10 is a plan view conceptually illustrating an example of a configuration of the photomask 40. The photomask 40 is a mask configured to realize an exposure pattern corresponding to the desired shapes of the cover layer 23A and the spacer 23B by transmitting only some of the emitted light.

As illustrated in FIG. 10, a translucent region 41 (a translucent portion) for forming the cover layer 23A, a light blocking region 42 (a light blocking portion) for forming the spacer 23B, and a light-transmitting region 43 (a light-transmitting portion) are formed in the photomask 40. The light-transmitting region 43 is a region between the translucent region 41 and the light blocking region 42.

As illustrated in FIGS. 6 and 7, in the exposure process, the cover layer 23A is formed directly below the translucent region 41, the spacer 23B is formed directly below the light blocking region 42, and the spacing region 23C is formed directly below the light-transmitting region 43.

The translucent region 41 is a region that is formed adjacent to the light-transmitting region 43 and partially transmits the emitted light. A plurality of fine openings or fine slits that cannot be resolved by the exposure device 33 that is used are formed in the translucent region 41. Since the cover layer 23A is not completely removed in the developing process due to the light passing through the translucent region 41, the cover layer 23A with a low height H is formed. For this reason, the height H1 of the cover layer 23A can be set by the transmittance depending on the fine openings or the fine slits of the translucent region 41. The light transmittance of the translucent region 41 may be set to a preferable value depending on the desired height of the cover layer 23A.

The light blocking region 42 is a region that blocks nearly 100% of the emitted light. For this reason, the film surface of the spacer 23B corresponding to the light blocking region 42 is not affected by the emitted light, and the spacer 23B is not etched through exposure, and the height H2 thereof remains the same. The light blocking region 42 illustrated in FIG. 7 has a quadrangular shape, but the shape of the light blocking region 42 may be a polygonal shape such as a triangle, or may have other shapes such as a circle, a semicircle, or an ellipse. The size of the light blocking region 42 may also be set to a size that can ensure the width required for the spacer 23B to function as a spacer.

In addition, the light blocking region 42 is formed between regions corresponding to the anodes 22 (regions indicated by dashed lines in FIG. 10). The shape of the anode 22 is not particularly limited to a specific shape and may be a shape other than the shape illustrated in FIG. 10, such as a diamond shape or a circular shape.

The forming position and the formation interval of the light blocking region 42 are not particularly limited to a specific position and interval, and the light blocking region 42 may be formed on the left and right or the upper and lower sides of the region corresponding to the anode 22, or may be provided on the left, right, upper, and lower sides of the region. In addition, one light blocking region 42 may be formed for each anode 22, or may be formed for a predetermined number of anodes 22. In other words, the numerical and positional relationship between the spacer 23B and the anode 22 can be freely set.

The light-transmitting region 43 is a region that transmits emitted light. For this reason, exposure causes the solubility of the photosensitive organic material directly below the light-transmitting region 43 to be increased, and the photosensitive organic material is completely removed in the developing process. As a result, the spacing region 23C is formed.

In addition, a light-transmitting region 44 (a light-transmitting portion) configured to define an outer edge of the exposed surface of the anode 22 is formed in the photomask 40. Light passing through the light-transmitting region 44 increases the solubility of some of the photosensitive organic material covering the surface of the anode 22, and a part of the surface of the anode 22 is exposed. The use of such a photomask 40 allows the cover layer 23A, the spacer 23B, and the exposed surface of the anode 22 to be formed through once photolithography.

COMPARATIVE EXAMPLE

Figure 11:
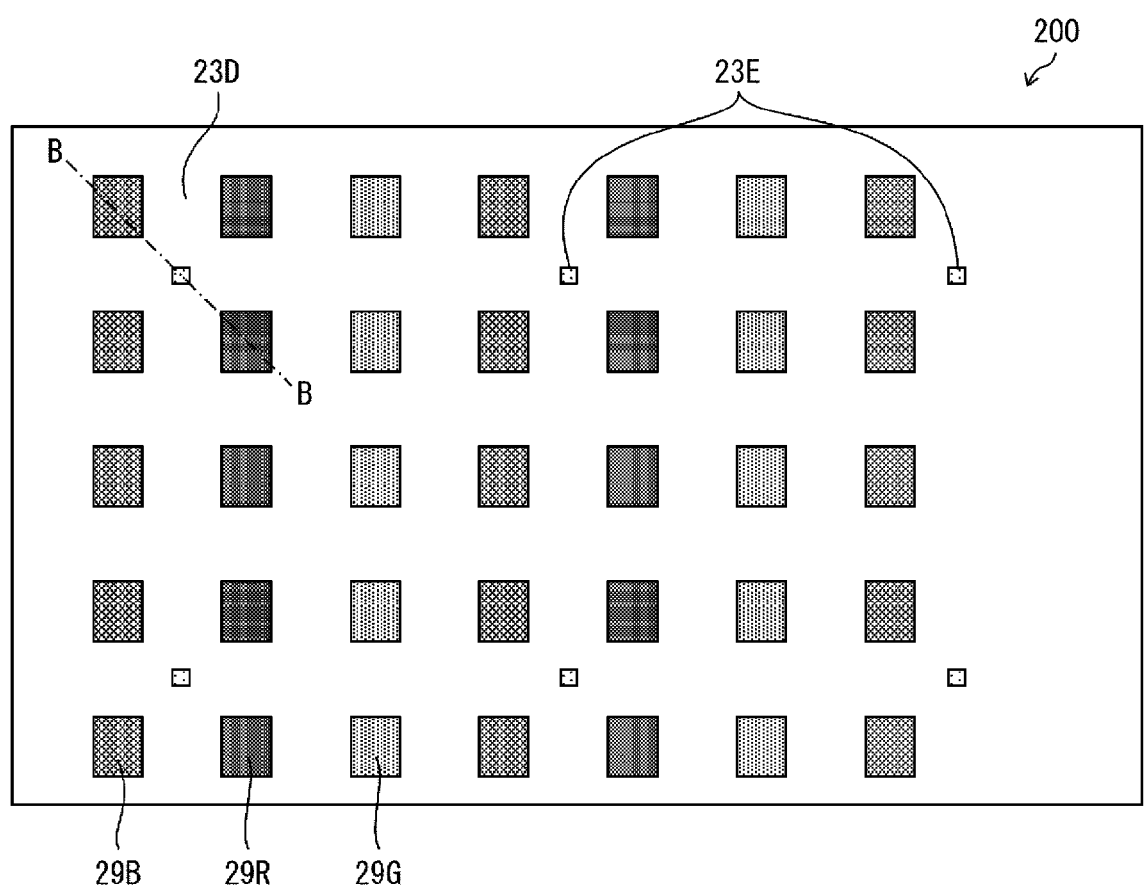
FIG. 11 is a plan view illustrating arrangement of a subpixel, a cover layer, and a spacer in a display device of a comparative example.
Figure 12:
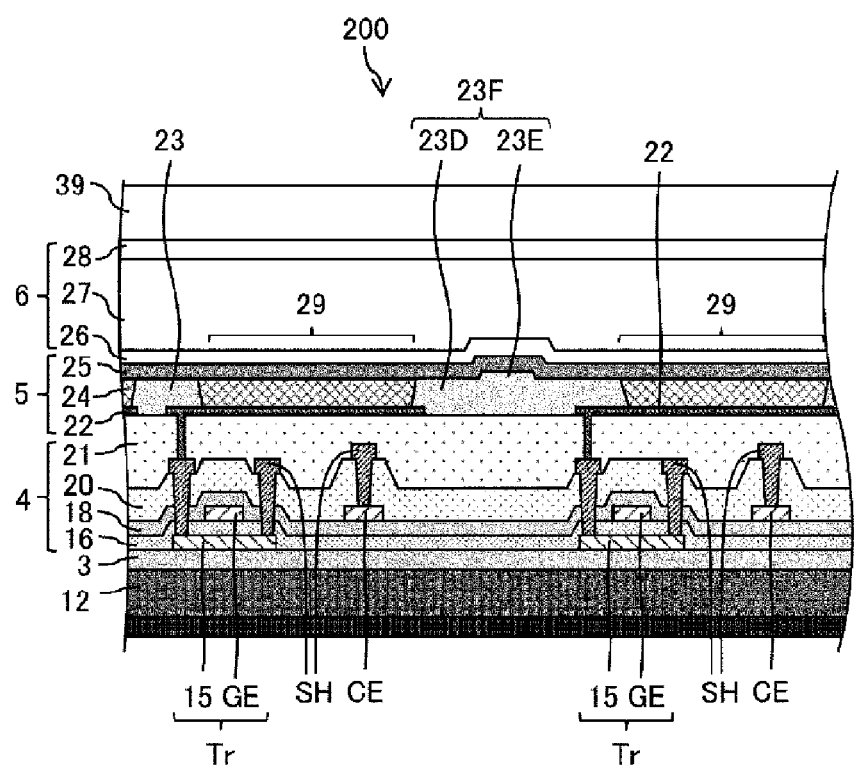
FIG. 12 is a cross-sectional view taken along line B-B in FIG. 11, illustrating a configuration example of a display portion of a display device of the comparative example.
Figure 13:
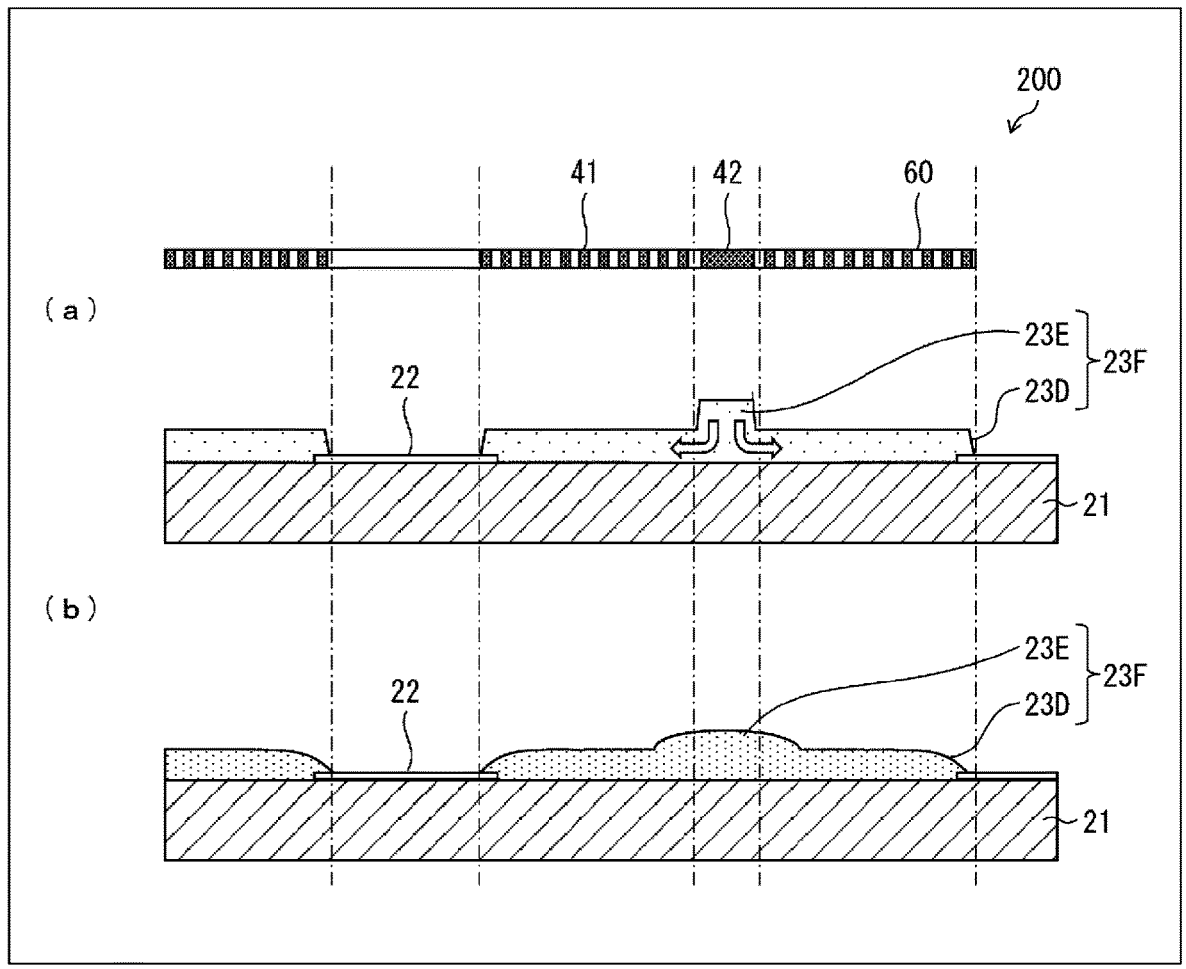
FIG. 13 is a cross-sectional view illustrating a method of forming a bank in the comparative example.

FIG. 11 is a plan view illustrating arrangement of a subpixel 29, a cover portion 23D, and a spacer 23E in a display device 200 of a comparative example. FIG. 12 is a cross-sectional view taken along line B-B in FIG. 11, illustrating a configuration example of a display portion of the display device 200. FIG. 13 is a cross-sectional view illustrating a method of forming a bank 23F in the comparative example. (a) of FIG. 13 illustrates a state before baking, and (b) of FIG. 13 illustrates a state after baking.

Here, a problem in the case of forming the cover layer 23A and the spacer 23B as an integrated body (as the bank 23F) will be described. A portion of the bank 23F corresponding to the cover layer 23A is referred to as a cover portion 23D, and a portion corresponding to the spacer 23B is referred to as a spacer 23E.

In a case where exposure is performed using a photomask 60 including the translucent region 41 and the light blocking region 42, and thereafter baking is performed, heat sagging of the spacer 23E occurs, and the spacer 23E is absorbed by the cover portion 23D. This makes it difficult to achieve the desired height of the spacer 23E.

Effects of Embodiment

Meanwhile, according to the embodiment, as illustrated in FIG. 7, the spacing region 23C is formed around the spacer 23B, and the spacer 23B is spaced from the cover layer 23A. In a case where baking is performed in this state, the surface tension generated at the surface of the flattening film 21 prevents heat sagging of the spacer 23B, and the spacer 23B thermally deforms without heat sagging. This can provide the spacer 23B with the desired height H2.

The position where the spacer 23B is formed is not limited to the surface of the flattening film 21. For example, the spacer 23B may be formed on an insulated anode 22 or may be formed on the inorganic film.

Flow of Processing

Figure 14:
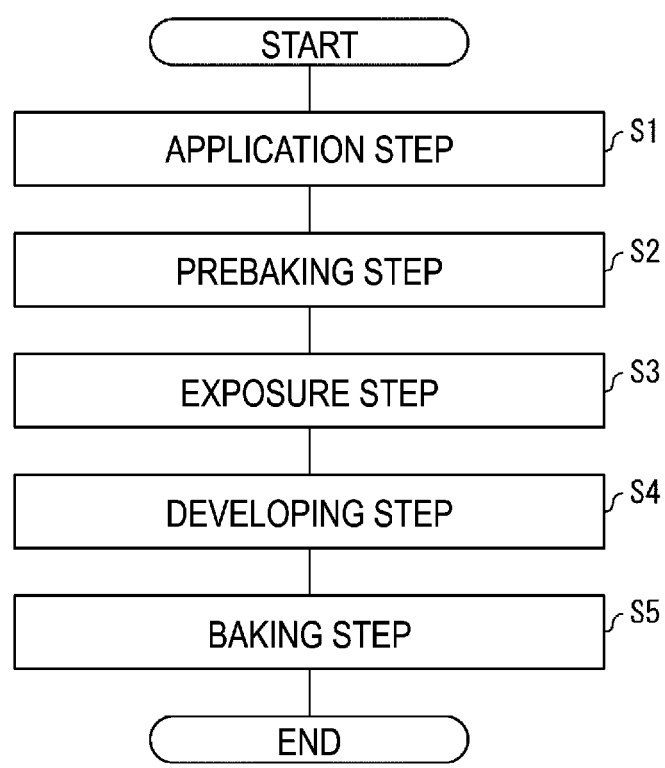
FIG. 14 is a flowchart illustrating an example of a flow of processing in a film formation device.

FIG. 14 is a flowchart illustrating an example of a flow of processing (photolithography process) in the film formation device 30. First, the coating device 31 applies a photosensitive organic material on the surface of the flattening film 21 (S1).

Thereafter, the display device 2A is sent into the heating device 32 and prebaked at from 90 to 120° C., for example (S2).

After heating, the exposure device 33 performs an exposure process (S3). First, in the exposure device 33, the photomask 40 is positioned with respect to the photosensitive organic film to be exposed. Then, the exposure device 33 turns on the light source 35 to irradiate the organic film with emitted light through the photomask 40.

The display device 2A exposed is developed in the developing device 34 to form the cover layer 23A and the spacer 23B in a shape corresponding to the pattern of the photomask 40 (S4).

Finally, the display device 2A is sent into a heating device (not illustrated) and baked at from 200 to 250° C., for example (S5).

After the cover layer 23A and the spacer 23B are formed, an organic light-emitting material, which is a vapor deposition source and vaporized or sublimated under vacuum, is vapor deposited on the anode 22 through the vapor deposition mask 50 to form the EL layer 24 (organic layer) (a vapor deposition step). At this time, the vapor deposition is performed while the vapor deposition mask 50 is in contact with the spacer 23B. The vapor deposition method is not particularly limited to a specific method, and a known method may be used. Methods of manufacturing such a display device 2 are also included within the technical scope of the present disclosure.

Second Embodiment

Figure 15:
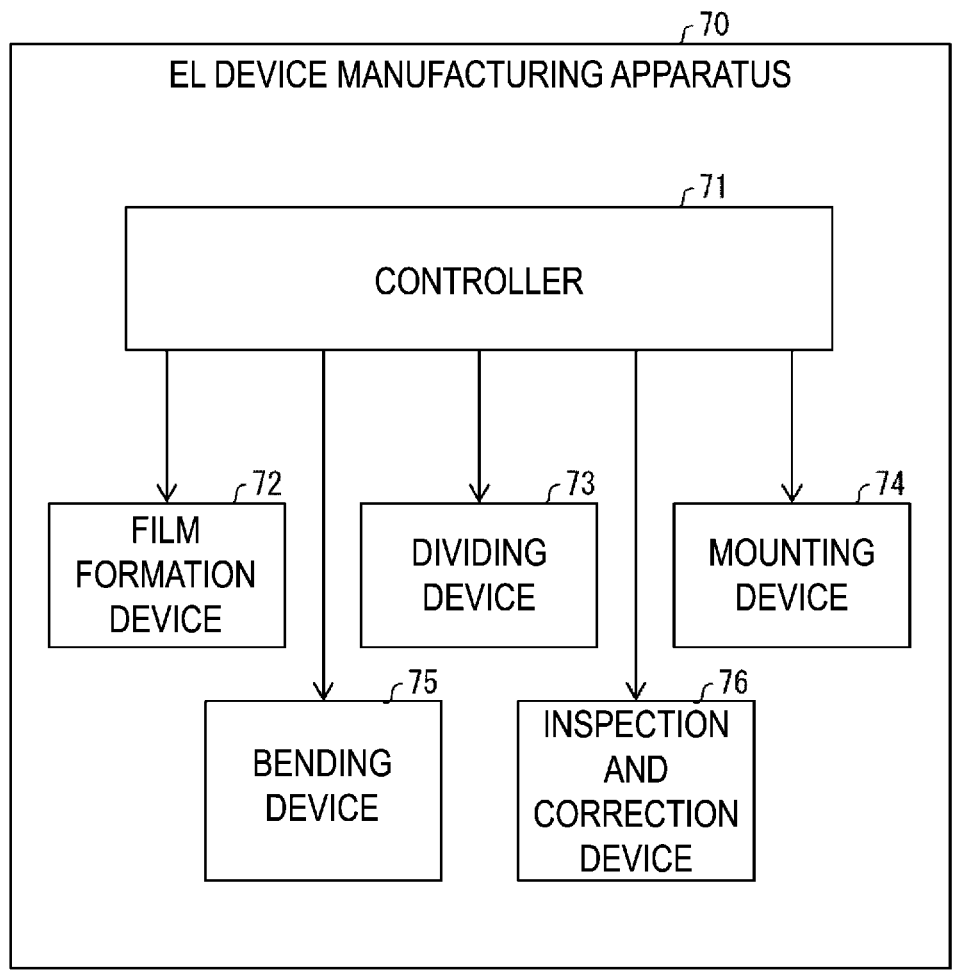
FIG. 15 is a block diagram illustrating a configuration of an EL device manufacturing apparatus.

FIG. 15 is a block diagram illustrating a configuration of a manufacturing apparatus of the display device 2. As illustrated in FIG. 15, an EL device manufacturing apparatus 70 configured to manufacture the display device 2 includes a film formation device 72, a dividing device 73, a mounting device 74, a bending device 75, and an inspection and correction device 76, and further includes a controller 71 configured to control these devices. The film formation device 30 is included in the EL device manufacturing apparatus 70 as one of the film formation devices 72.

Thus, the EL device manufacturing apparatus 70 including the film formation device 30 is also included within the technical scope of the present disclosure.

Third Embodiment

Figure 16:
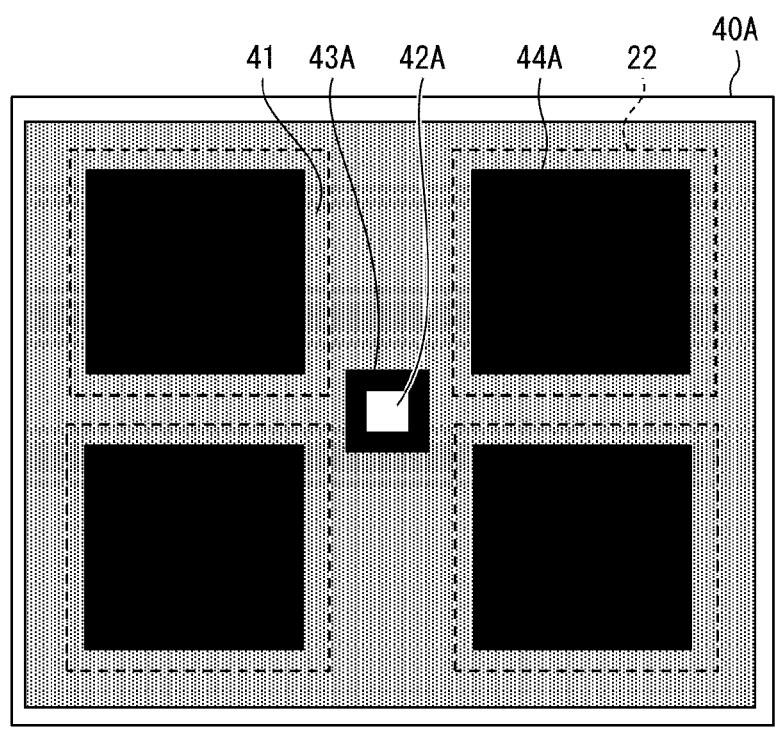
FIG. 16 is a plan view illustrating an example of a configuration of a negative photomask.

Although a photomask 40 for performing positive type photolithography is illustrated in FIG. 16, the exposure device 33 may include a negative type photomask 40A. FIG. 16 is a plan view illustrating an example of a configuration of the negative type photomask 40A. In the photomask 40A, a region corresponding to the light blocking region 42 is a light-transmitting region 42A (a light-transmitting portion), and a region corresponding to the light-transmitting region 43 is a light blocking region 43A (a light blocking portion). In addition, a region corresponding to the light-transmitting region 44 is a light blocking region 44A (a light blocking portion).

In the negative type photolithography, a portion of the photosensitive organic material not irradiated with light emitted from the light source 35 is removed in the developing process.

Fourth Embodiment

Figure 17:
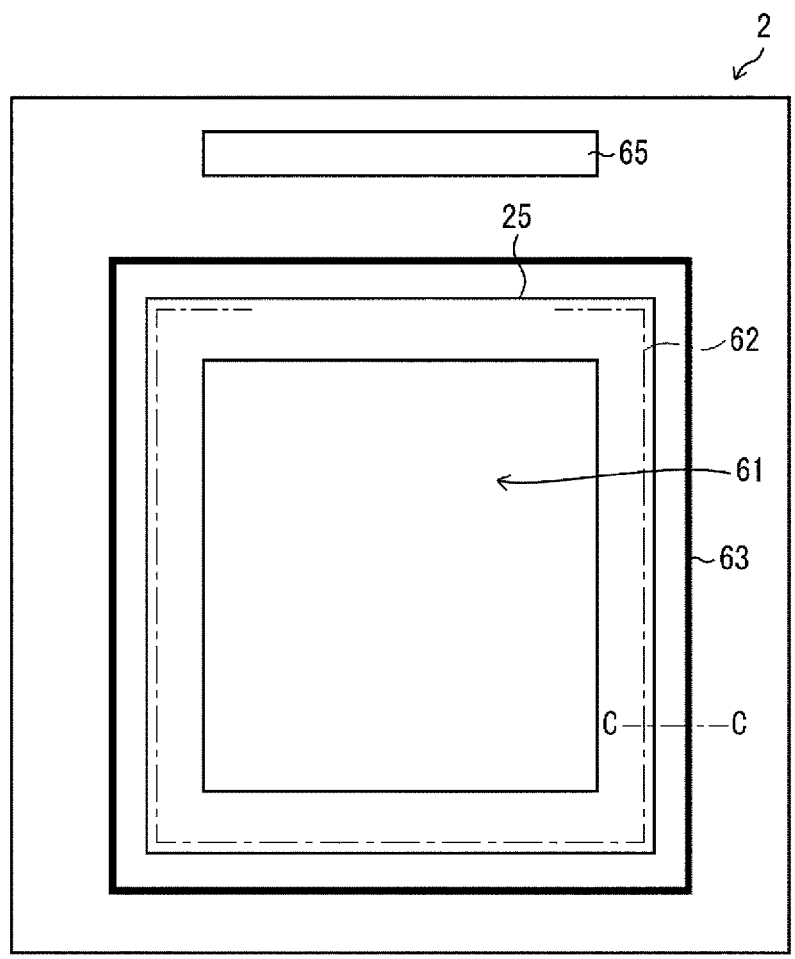
FIG. 17 is a plan view illustrating a configuration of a display region and a region surrounding the display region.
Figure 18:
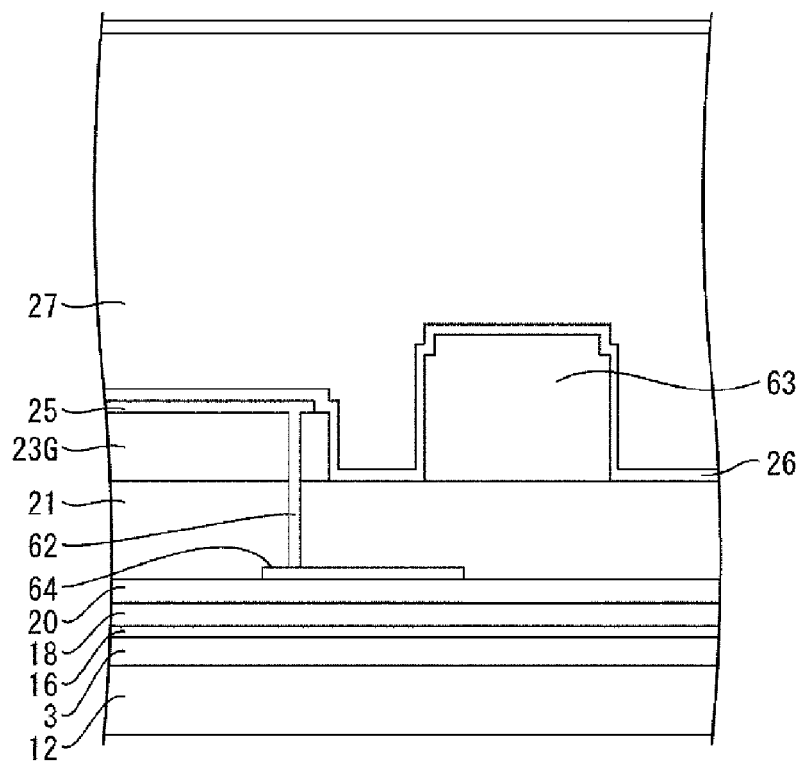
FIG. 18 is a cross-sectional view taken along line C-C in FIG. 17.

FIG. 17 is a plan view illustrating a configuration of a display region and a region surrounding the display region. FIG. 18 is a cross-sectional view taken along line C-C in FIG. 17. As illustrated in FIG. 17, a slit 62 is formed surrounding a display region 61, which is a region including the plurality of subpixels 29. The slit 62 is a contact hole for electrical conduction between the cathode 25 and a wiring line 64 of the TFT layer 4. A frame spacer 63 having a frame shape is formed surrounding the periphery of the slit 62. Furthermore, a terminal portion 65 is formed on an outer side thereof.

As illustrated in FIG. 18, the outer edge portion of the cathode 25 formed covering the display region 61 and the wiring line 64 of the TFT layer 4 are electrically connected via the slit 62. The slit 62 is formed in an organic film 23G in the same layer as the cover layer 23A and the flattening film 21, and the cathode 25 and the wiring line 64 of the TFT layer 4 are electrically conducted via the slit 62.

The frame spacer 63 has a height identical to that of the spacer 23B, and similarly to the spacer 23B, functions as a contact surface of the vapor deposition mask 50. The cover layer 23A and the frame spacer 63 are separated from each other, and as with the relationship between the cover layer 23A and the spacer 23B, it is easy to set the height of the frame spacer 63 to a desired height. The frame spacer 63 is positioned in the same layer as the cover layer 23A and the spacer 23B, and is formed from the same organic photosensitive material in the same photolithography process as the cover layer 23A and the spacer 23B.

Supplement

A display device according to a first aspect is a display device including a plurality of picture elements. A first electrode is formed in each of the plurality of picture elements, a cover layer is formed such that an opening of the first electrode is formed, a spacer in a layer identical to the cover layer is provided between two of the first electrodes, the spacer is formed with a height greater than a height of the cover layer, and an outer edge portion of the spacer is spaced from an outer edge portion of the cover layer.

In the display device according to a second aspect, the cover layer and the spacer are formed from the same photosensitive organic material.

In the display device according to a third aspect, an outer edge portion of the cover layer and an outer edge portion of the spacer are formed at intervals that are equal to or greater than resolution of an exposure device to be used.

In the display device according to a fourth aspect, an outer edge portion of the cover layer and an outer edge portion of the spacer are formed at an interval of 2 µm or greater.

In the display device according to a fifth aspect, the spacer is formed on a surface of an organic film.

The display device according to a sixth aspect further includes a second electrode opposite to the first electrode, and a light-emitting layer is formed between the first electrode and the second electrode.

In the display device according to a seventh aspect, the cover layer is layered on an surface of the organic film, a slit is formed in the organic film surrounding the display region including the plurality of picture elements, the second electrode and a wiring line of a thin film transistor layer are electrically conducted via the slit, a frame spacer in a layer identical to the cover layer is formed surrounding the display region and the slit, and the frame spacer has a height identical to a height of the spacer.

An exposure device according to an eighth aspect is an exposure device configured to perform patterning through photolithography. The exposure device includes a light source configured to emit light to an organic film and a photomask configured to block some of the light from the light source. The photomask includes a light blocking portion configured to block the light, a light-transmitting portion formed around the light blocking portion and configured to allow transmission of the light, and a translucent portion formed adjacent to the light-transmitting portion and configured to allow partial transmission of the light.

In the exposure device according to a ninth aspect, the translucent portion is formed surrounding the light-transmitting portion, and the light-transmitting portion is formed surrounding the light blocking portion.

The exposure device according to a tenth aspect is an exposure device configured to perform patterning through photolithography. The exposure device includes a light source configured to emit light to an organic film and a photomask configured to block some of the light from the light source. The photomask includes a light-transmitting portion configured to allow transmission of the light, a light blocking portion formed around the light-transmitting portion and configured to block the light, and a translucent portion formed adjacent to the light blocking portion and configured to allow partial transmission of the light.

In the exposure device according to an eleventh aspect, the translucent portion is formed surrounding the light blocking portion, and the light blocking portion is formed surrounding the light-transmitting portion.

A method for manufacturing a display device according to a twelfth aspect includes disposing a photomask with respect to a photosensitive organic film to perform patterning through photolithography and emitting light to the photosensitive organic film through the photomask. The photomask includes a light blocking portion configured to block the light, a light-transmitting portion formed around the light blocking portion and configured to allow transmission of the light, and a translucent portion formed adjacent to the light-transmitting portion and configured to allow partial transmission of the light.

The method for manufacturing a display device according to a thirteenth aspect further includes causing an organic layer to be vapor deposited with a vapor deposition mask in contact with a spacer formed by blocking the light using the light blocking portion.

An electro-optical element (an electro-optical element whose luminance and transmittance are controlled by an electric current) that is provided in a display device according to the present embodiment is not particularly limited thereto. Examples of the display device according to the present embodiment include an organic Electro Luminescence (EL) display provided with the Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

The invention claimed is:

1. A display device comprising:
a plurality of picture elements,
wherein a first electrode is formed in each of the plurality of picture elements,
a second electrode opposite to the first electrode,
a light-emitting layer is formed between the first electrode and the second electrode,
a cover layer is formed such that an opening of the first electrode is formed,
a spacer is provided between two of the first electrodes, the spacer and the cover layer are formed of a same material through a same process,
wherein a width of the spacer is from 8 μm to 12 μm,
the spacer is formed with a height greater than a height of the cover layer, the spacer is provided in a display portion,
wherein the height of the cover layer is from 1 μm to 3 μm,
an outer edge portion of the spacer is spaced from an outer edge portion of the cover layer, and
wherein the outer edge portion of the cover layer and the outer edge portion of the spacer are formed at an interval of 2 μm to 5 μm.

2. The display device according to claim 1, wherein the cover layer and the spacer are formed from the same photosensitive organic material.

3. The display device according to claim 1, wherein the outer edge portion of the cover layer and the outer edge portion of the spacer are formed at intervals equal to or greater than a resolution of an exposure device to be used.

4. The display device according to claim 1, wherein the spacer is formed on a surface of an organic film.

* * * * *